United States Patent
Gao

(10) Patent No.: US 8,181,143 B2
(45) Date of Patent: May 15, 2012

(54) METHOD AND APPARATUS FOR GENERATING A MEMORY-EFFICIENT REPRESENTATION OF ROUTING DATA

(75) Inventor: Tong Gao, Cupertino, CA (US)

(73) Assignee: Synopsys, Inc., Mountain View, CA (US)

(*) Notice: Subject to any disclaimer, the term of this patent is extended or adjusted under 35 U.S.C. 154(b) by 393 days.

(21) Appl. No.: 12/605,247

(22) Filed: Oct. 23, 2009

(65) Prior Publication Data

US 2011/0041111 A1 Feb. 17, 2011

Related U.S. Application Data

(60) Provisional application No. 61/233,602, filed on Aug. 13, 2009.

(51) Int. Cl.
*G06F 17/50* (2006.01)
(52) U.S. Cl. .......................................... 716/130; 716/129
(58) Field of Classification Search ........... 716/126–131
See application file for complete search history.

(56) References Cited

U.S. PATENT DOCUMENTS 5,375,069 A * 12/1994 Satoh et al. ................... 716/130
7,197,738 B1 * 3/2007 Hetzel et al. .................. 716/126

* cited by examiner

*Primary Examiner* — Vuthe Siek
*Assistant Examiner* — Binh Tat
(74) *Attorney, Agent, or Firm* — Park, Vaughan, Fleming & Dowler LLP; Laxman Sahasrabuddhe

(57) ABSTRACT

Some embodiments provide a system for generating a memory-efficient representation of a sequence of electrically connected routing shapes. The memory-efficient representation represents the sequence of electrically connected routing shapes using a sequence of points, such that two consecutive points represent a routing shape. At least some of the points can be represented using a compact representation, thereby reducing the memory required for storing the sequence of points. A full representation specifies a point's location using the point's two-dimensional coordinates, and a compact representation specifies a point's location using one of the point's two-dimensional coordinates and an orientation indicator which indicates the routing shape's orientation. The missing coordinate in a compact representation can be determined from the preceding points. The system can represent a via that joins two routing shapes by assigning different metal layers to the points associated with the two routing shapes.

18 Claims, 10 Drawing Sheets

METHOD AND APPARATUS FOR GENERATING A MEMORY-EFFICIENT REPRESENTATION OF ROUTING DATA

RELATED APPLICATIONS

This application claims priority to U.S. Provisional Application No. 61/233,602, entitled "Efficient Compact-Level Shape Representation for Routing," by Tong Gao, filed 13 Aug. 2009, the contents of which are herein incorporated by reference.

Further, the subject matter of this application is related to the subject matter in a co-pending non-provisional application by inventors Shankar Kuppuswamy and Tong Gao, filed on the same day as the instant application, entitled "Method and Apparatus for Generating a Centerline Connectivity Representation," U.S. patent application Ser. No. 12/605,272.

BACKGROUND

1. Technical Field

This disclosure generally relates to electronic design automation. More specifically, this disclosure relates to methods and apparatuses for generating a memory-efficient representation of routing data.

2. Related Art

Performing routing on a circuit design is a computationally intensive process which can take several days to complete. One of the problems with performing routing on today's large circuit designs is the size of the routing data. Specifically, in conventional routing techniques, the routing data for an entire circuit design usually cannot be stored on the physical memory of a computer system.

One approach for overcoming the size problem is to load only a portion of the routing data on physical memory and keep the remaining data on the disk. Unfortunately, the overhead associated with transferring data between physical memory and disk significantly degrades performance. Hence, it is generally desirable to be able to store the entire routing data on physical memory.

SUMMARY

One embodiment provides techniques and systems for generating a memory-efficient representation of a sequence of electrically connected routing shapes. The memory-efficient representation represents the sequence of electrically connected routing shapes using a sequence of points, such that two consecutive points represent a routing shape. A full representation specifies a point's location using the point's two-dimensional coordinates, and a compact representation specifies a point's location using one of the point's two-dimensional coordinates and an orientation indicator which indicates the routing shape's orientation.

In some embodiments, the system can represent at least some of the points in the sequence of points using a compact representation, thereby substantially reducing the memory requirement for storing the sequence of points.

In some embodiments, the system represents a via that joins two routing shapes by assigning different metal layers to the points associated with the two routing shapes. For example, suppose a first point represents the beginning of a first routing shape, and a second point represents the end of the first routing shape and the beginning of a second routing shape. Further, suppose that the layer assigned to the first point corresponds to the layer assigned to the first routing shape, and the layer assigned to the second point corresponds to the layer assigned to the second routing shape. If the two layers are different, it implies that a via exists between the two routing shapes.

Note that it may be inefficient to derive coordinates of a shape that is located far from the starting point. To solve this problem, the system can ensure that at least one point in a certain number of consecutive points is represented using a full point representation. For example, the system can ensure at least one point in any two consecutive points is represented using a full point representation. In this example, the full coordinates for any compact point can be determined by looking up the information of the previous point in the sequence of points which is guaranteed to be a full point. The representation of a point can be converted from one type to another. For example, in some embodiments, the system can convert a compact representation into a full representation to ensure that at least one of any two consecutive points in the sequence of points is represented using a full representation. Further, if a point is deleted, the system can convert the representation of the subsequent point into a full representation if required, e.g., if the previous point is represented using a compact representation.

In some embodiments, if a patch shape is located at an intersection of two routing shapes, the system can associate information about the patch shape with the representation of the point that corresponds to the intersection of the two routing shapes.

In some embodiments, the system represents the last point in a sequence of points using a separate type of representation called an endpoint representation. If the sequence of points is divided into a first sequence of points and a second sequence of points, the system can convert the last point in the first sequence of points into an endpoint representation.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit (IC) Design Flow

Figure 1:
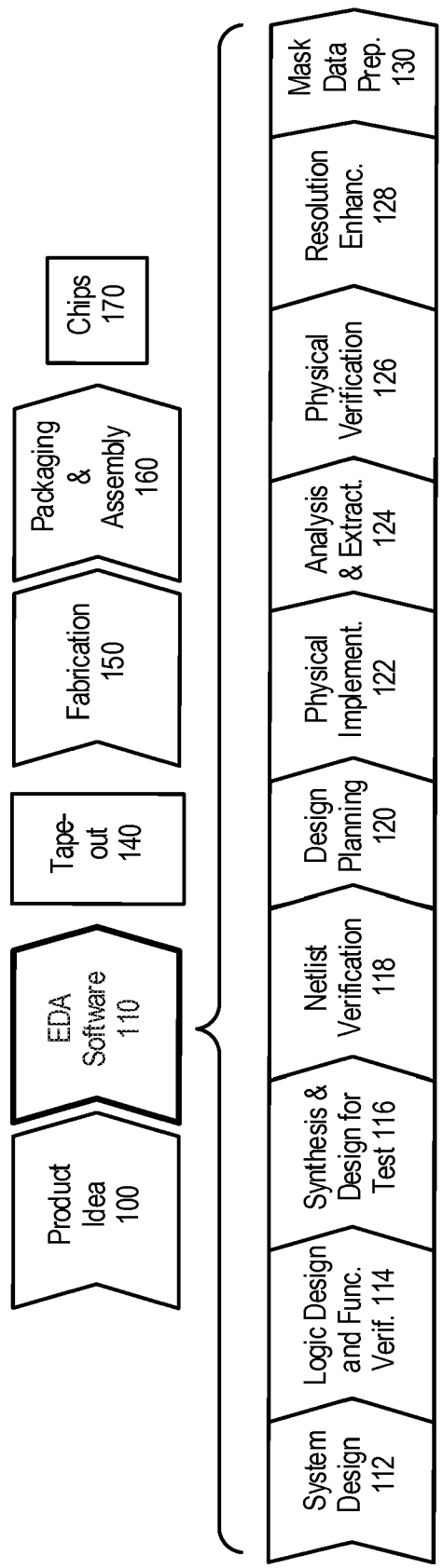
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®.

Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, TetraMAX®, and DesignWare®.

Netlist verification (operation 118): In this stage, the netlist is checked for compliance with timing constraints and for correspondence with the VHDL/Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXTT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

The Routing Problem

Figure 2:
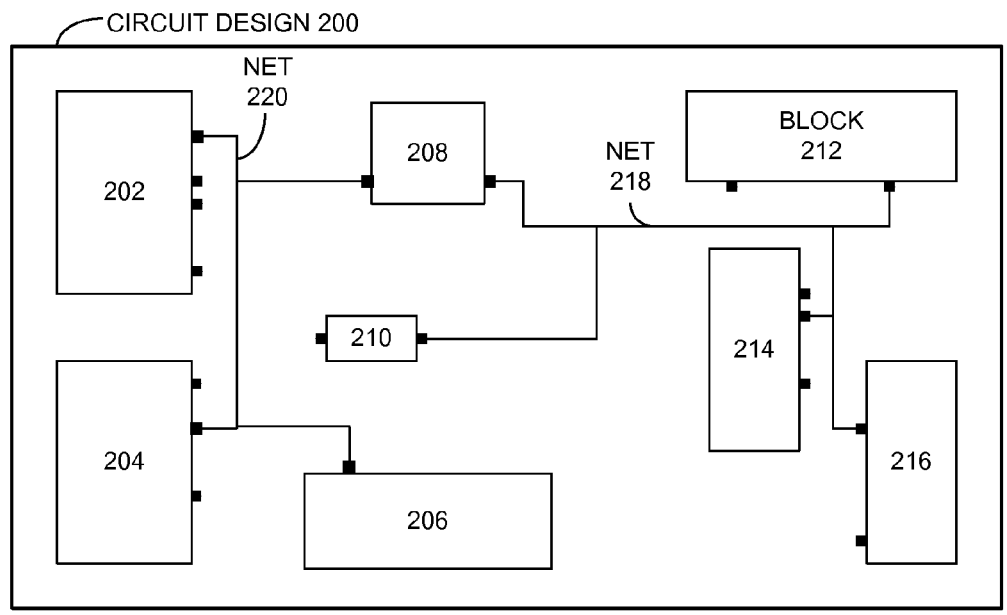
FIG. 2 illustrates an exemplary circuit design that presents a typical routing problem in accordance with an embodiment of the present invention.

FIG. 2 illustrates an exemplary circuit design that presents a typical routing problem in accordance with an embodiment of the present invention.

Circuit design 200 includes a set of blocks (e.g., blocks 202-216) that may represent circuit objects at any level in the design hierarchy. For example, the blocks can be cells, macros, or any other circuit object at any level of hierarchy. The routing process can be performed at different levels in the design hierarchy. However, the routing process typically operates at only one level at any given time.

The routing process or system can take multiple inputs, which include, but are not limited to: (a) a placed netlist which provides placement information for a set of cells, (b) a description of the technology (i.e., the number of metal layers, and the characteristics of the layers), (c) an assignment of pins/terminals to nets, (d) a set of design rules that must be satisfied by the routing solution, and (e) timing information, e.g., timing criticality.

The output of the routing system includes, but is not limited to, a netlist which electrically connects all pins/terminals that belong to each net, and a routing summary which can include wire length, via count, and unresolved DRCs.

A block of the circuit design can have one or more pins or terminals that are assigned to nets. The task for the routing system is to route wires in the circuit design so that the pins or terminals that belong to the same net are electrically connected together. For example, net 220 electrically connects pins in blocks 202-208, and net 218 electrically connects pins in blocks 208-216.

Note that a routing system should not generate a routing solution that electrically connects pins or terminals that belong to different nets. Further, the routing system should generate a routing solution that routes the wires using only the available routing resources, and the routed solution must not violate design rules (note that the design rules are usually provided as an input to the routing problem). For example, the design rules may specify that the distance between two adjacent wires should be greater than a minimum distance, and that certain types of routing shapes are not allowed.

The design rules that need to be satisfied during routing may be different from the design rules that need to be satisfied in a different stage in the electronic design automation (EDA) flow. Specifically, the design rules that are used during design signoff may be more precise and complicated than the design rules that are used during the routing stage.

During the placement stage, some techniques may perform a trial routing to guide the placement. For example, the placement technique may perform a quick and approximate routing to determine whether a particular placement of cells is expected to cause routing congestion. A trial routing may also be performed to determine a timing estimate, and may be performed during a routing optimization process.

A routing process typically has three stages: global routing, track assignment, and detailed routing. However, the number of stages in the process can be more or less than three. For example, some techniques collapse the last two stages so that they only have two stages: global routing and detailed routing.

In another example, the routing process might include a fourth stage which places redundant vias.

In the global routing stage, the system does not create detailed routing shapes for the wires. Instead, the system determines the topologies of multi-pin nets and areas that the nets should go through to minimize routing congestion and minimize the overall wire length.

In the track assignment stage, the system refines the global routing plan by assigning wires to tracks. Note that, although the track assignment may generate detailed routes for the wires, the routing solution at this stage may not satisfy all of the design rules because this stage typically uses a simpler routing model than the next stage, namely, detailed routing.

Finally, in the detailed routing stage, the system creates the exact path and the specific shapes for each wire. This stage is typically the most time-consuming and computationally intensive stage of the three stages. Note that all of the design rules are typically used in this stage to ensure that the routed wires do not violate any of the design rules.

Routing techniques typically operate at one physical hierarchy at a time. For example, during block level routing, the system does not work on the physical details inside cells or the macros. The system typically abstracts the cells and the macros to hide unnecessary details, thereby speeding up the routing process. At the top level, the system typically represents macros and standard cells as blocks. Each macro and standard cell typically has multiple pins which need to be electrically connected together based on their net assignments.

Note that routing can be performed using different approaches. For example, routing can be performed using a top-down approach or a bottom-up approach. In the top-down approach, the top-level routing is performed before bottom-level routing. In this approach, the system may create soft-macros which reserve space for routing the lower hierarchies.

In contrast, in the bottom-up approach, the bottom-level routing is performed before the top-level routing. Since the lower-level routing is performed before higher-level routing, soft-macros are usually not required in this approach.

There are a number of optimization criteria that need to be considered during routing. Specifically, the optimization criteria include, but are not limited to: (a) minimizing design rule violations, (b) minimizing via count, (c) minimizing total wire length, (d) minimizing the likelihood of timing violations, and (e) criteria related to design for manufacturing (DFM), e.g., placing redundant vias, trying to minimize critical area to reduce the probability that contamination particles will cause shorts and opens during manufacturing, and trying to maximize straight wire segments to decrease layout complexity and increase manufacturability. Note that conventional routing techniques typically consider the first three criteria, i.e., minimizing design rule violations, minimizing via count, and minimizing wire length. However, conventional routing techniques usually do not consider DFM criteria.

Note that it may not be possible to "optimize" (e.g., "minimize") all of the criteria at the same time. In fact, it may not be possible to determine a global optimum for even a single criterion. Hence, the terms "optimizing," "minimizing," etc. are used in this disclosure to indicate that the routing process tries to optimize one or more criteria (e.g., tries to minimize the number of design rule violations), but the routing process may terminate before a global optimum is determined for one or more criteria.

Timing considerations are important during routing. A routing process can use a trial routing solution that estimates the actual routing solution to identify critical nets which need special handling during the actual routing process. Specifically, the system can determine a trial routing solution either during placement or timing analysis. Next, the system can perform timing analysis on the trial routing solution to identify a set of critical nets, and provide the set of critical nets to the routing stage. During the routing stage, the system can ensure that the delays on the critical nets are minimized to reduce or eliminate timing constraint violations.

Note that conventional techniques typically optimize the various optimization criteria in a serial or sequential fashion. For example, a conventional technique may begin by optimizing the wire length to obtain an initial routing solution. Next, the conventional technique may perturb the initial routing solution to minimize via count and design rule violations. The technique may then further perturb the perturbed routing solution to optimize other parameters. Unfortunately, many optimization objectives may conflict with each other, and it is difficult to optimize new objectives on routes generated based on previously specified objectives without loosing quality in previous objectives. Therefore, this serial approach can result in suboptimal routing solutions, and may require a long time to converge.

Memory-Efficient Representation of Routing Shapes

It is very challenging to efficiently represent routing shape data, especially when connectivity information also needs to be preserved. Note that the routing problem needs to know many details of the circuit design, and it generates detailed routing shapes as output. In particular, a routing system needs to store the routing shapes for the entire chip in physical memory because the routing system frequently accesses this information during operation. Hence, if the representation of the routing shapes is not memory-efficient, the routing information for a circuit design can easily overwhelm the memory resources of the routing system, and can become a capacity bottleneck.

A routing shape can be represented using a set of rectangles. A conventional technique may represent a rectangle by its corners and the layer. However, this requires a large amount of data to be stored per rectangle: two integers for each corner, and an integer for the layer, which is a total of nine integers per rectangle.

If a routing system stores only a small portion of the routing shape data in physical memory, and stores the remainder of the routing shape data on disk, the performance of the routing system is likely to become extremely slow due to the large disk access latency. Hence, for performance reasons, the routing shapes for an entire chip preferably need to be stored in physical memory. Unfortunately, conventional approaches for representing routing shapes are inefficient from a memory standpoint. Hence, in conventional approaches, either an extremely large amount of memory is required which makes the approach very costly due to hardware costs, or the routing becomes very slow due to heavy disk memory access.

Figure 3:
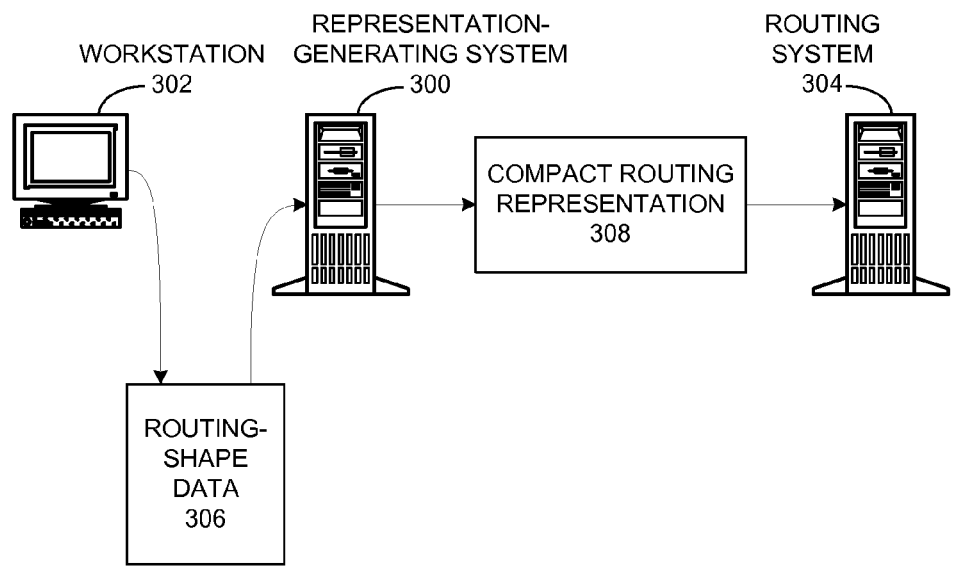
FIG. 3 illustrates a computing environment in accordance with an embodiment of the present invention.

FIG. 3 illustrates a computing environment in accordance with an embodiment of the present invention.

Specifically, a representation-generating system 300 receives routing shape data 306 for a circuit design from a workstation 302, and generates a compact routing representation 308 for the circuit design. Compact routing representation 308 represents the routing data in a highly memory-efficient manner.

Note that because compact routing representation 308 has a small memory footprint, routing system 304 can load complete routing shape data for the circuit design into a reasonable amount of physical memory. Note that, although shown as separate systems, workstation 302, representation-generating system 300, and routing system 304 can be the same system.

The highly memory-efficient data representation provided by compact routing representation 308 may not be suitable for manipulating routing shapes. Hence, routing system 304 can represent a portion of the routing shape data using a different representation which is inefficient in terms of memory usage, but which is efficient for manipulating routing shapes. As the routing process progresses, routing system 304 can check-in and check-out different portions of the routing shape data between the memory-efficient representation and the manipulation-efficient representation.

For example, the system may partition the design into a set of partitions. Next, the routing process may check-out a partition by converting a memory-efficient representation of the partition into a manipulation-efficient representation. Once the routing process completes processing the partition, the routing process can then check-in the partition by converting the manipulation-efficient representation into the memory-efficient representation. Note that, to check-out a partition of compact data into manipulation-efficient representation efficiently, the compact data needs to be accessed effectively by querying functions. For example, one should be able to determine the rectangle dimensions in constant time.

Figure 4:
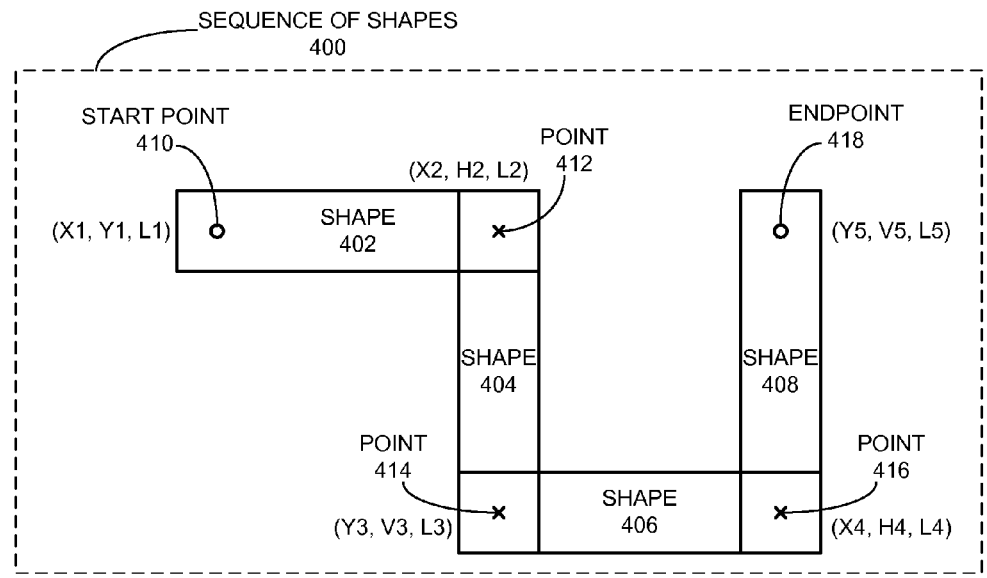
FIG. 4 illustrates a compact representation of a sequence of electrically connected routing shapes in accordance with an embodiment of the present invention.

FIG. 4 illustrates a compact representation of a sequence of electrically connected routing shapes in accordance with an embodiment of the present invention.

Specifically, FIG. 4 illustrates how a sequence of four rectangles (i.e., shapes 402-408) and three vias (points 412-416, shown using the "X" symbol) can be compactly represented using a sequence of points.

The memory-efficient representation can be viewed as being based on at least the following insight: the rectangles associated with a wire are not randomly located because they create an electrical link from one pin/terminal to another. This lack of randomness can be exploited to create a memory-efficient representation. Furthermore, electrical connectivity information is needed for routing anyways, and hence, very little additional processing is required for creating the compact representation.

Sequence of shapes 400 is represented using at least two types of point representations: full point representations and compact point representations. A full point representation specifies both an x-coordinate and a y-coordinate, and a compact point representation specifies only one of the two coordinates plus an orientation. The missing coordinate for a compact point can be determined from the preceding points.

Note that a via typically consists of three shapes: a metal shape on the lower metal layer (lower surround), a cut layer rectangle, and a metal shape on the higher metal layer (high surround). However, for the sake of clarity, FIG. 4 illustrates vias using the "X" symbol. Furthermore, since there are only a limited number of via types (which are defined by via masters), a via can be referred to in physical memory by its via master index, thereby further reducing the memory footprint of the routing representation.

As shown in FIG. 4, the location of a starting point 410 (which is arbitrary) is represented using a full point representation (X1, Y1, L1). The values (X1, Y1) indicate the x and y coordinates for point 410, and the value L1 indicates a metal layer that the corresponding shape is assigned to.

The next point in the sequence (i.e., point 412), which indicates the end of shape 402 and the beginning of shape 404, is represented by a compact point representation (X2, H2, L2). Here, "H2" can be a one-bit value that indicates that shape 402 is horizontally oriented, and hence, the y-coordinate of point 412 is the same as the y-coordinate of point 410. The layer "L2" can be a four-bit value that indicates the metal layer for shape 402. Note that the number of bits used for indentifying a layer is based on the number of layers in the chip. A 4-bit value can handle up to 16 layers, and more bits will be needed if the chip has more layers. If the layer is the same as a previous rectangle in the sequence, then no via is present at the intersection. On the other hand, if the layer is different from the previous rectangle in the sequence, then a via is present at the intersection. For example, if the value of L2 for point 412 is different from the value of L3 for point 414, then a via exists at point 412.

The next point in the sequence (i.e., point 414) is also represented by a compact point representation (Y3, V3, L3). Here, "V3" can be a one-bit value that indicates that shape 404 is vertically oriented, and hence, the x-coordinate of point 414 is the same as the x-coordinate of point 412. Furthermore, the layer "L3" can be a four-bit value that indicates the metal layer for shape 404. Similarly, point 416 and endpoint 418 can be represented using compact point representation. The wire width can also be stored in the compact representation (not shown in FIG. 4). Since the router typically uses a limited number of wire widths, the router can index all of the wire widths, and store width index at each compact point. Note that the wire index does not need a large number of bits, e.g., a 10-bit wire index can represent 1024 different widths, which is more than sufficient for most chip designs.

While the data representation illustrated in FIG. 4 can be used to store routing shapes in a memory-efficient manner, it may be inefficient to derive coordinates of a shape that is located far from the starting point. Specifically, the system needs to derive the coordinates of all of the intermediate points that lead up to the desired shape. To solve this problem, a routing system can ensure that at least one of two consecutive points is represented using a full point representation. In this manner, the full coordinates for any compact point can be determined by looking up the information of the previous point in the sequence of points which is guaranteed to be a full point.

While most routing shapes that are created in the routing process are intended to electrically link one point to the next point, the routing process also generates shapes that are used to fix certain types of design rule violations. These types of shapes can be represented using a type of point called a "point connect." A point connect representation describes a patch shape dangling from a point in the sequence of points, and it includes additional coordinate information to represent the dangling side of the patch shape.

Rip-up and Reroute

During routing, parts of the electrically connected shapes may be repeatedly ripped up (deleted) and rerouted. Therefore, it is important to have effective methods to update a sequence of shapes during such operations. For example, if a full point representation is deleted, the sequence of points may have two consecutive compact points. In such situations, one of the two compact points can be converted to a full point so that every two consecutive points in the sequence of points have at least one point that is represented using the full representation.

In other words, some embodiments of the present invention ensure that no routing operation leads to two consecutive compact points in the sequence of shapes. When two consecutive compact points exist as a result of a routing operation, the routing system can convert the representation of one of the two points into a full point representation. This can cause the sequence of points to include two consecutive full points. While two consecutive full points provides full information about the shape, it is not the most memory-efficient representation. Cleaning up the sequence of points so that it has alternating full and compact point representations might lead to cascading operations, which may not be run time efficient. In some embodiments, the system may choose to occasionally clean up the representation during routing to best balance run time and memory efficiency.

For better handling, some embodiments use an endpoint representation to denote the endpoint of a sequence of points. For example, if a sequence of electrically connected routing shapes is divided into two sequences of shapes during a rip-up operation, the last point in the first sequence of shapes can be converted into an endpoint representation.

Note that embodiments of the present invention may use multiple types of point representations to efficiently represent the electrically connected shapes and to support routing operations. Some embodiments implement these different types of representations using derived classes and virtual functions, which allow the different type of representations to be implemented independently of one another, while still keeping the interface generalized and uniform.

Specifically, the different types of representations can be implemented using an object-oriented programming language such as C++. The classes that implement the different types of representations can be derived from a common base class which specifies the virtual functions that are supported by the derived classes. When the routing process invokes a method for a point object, it will automatically execute the appropriate code based on the type of representation that is being used to represent the point.

Figure 5:
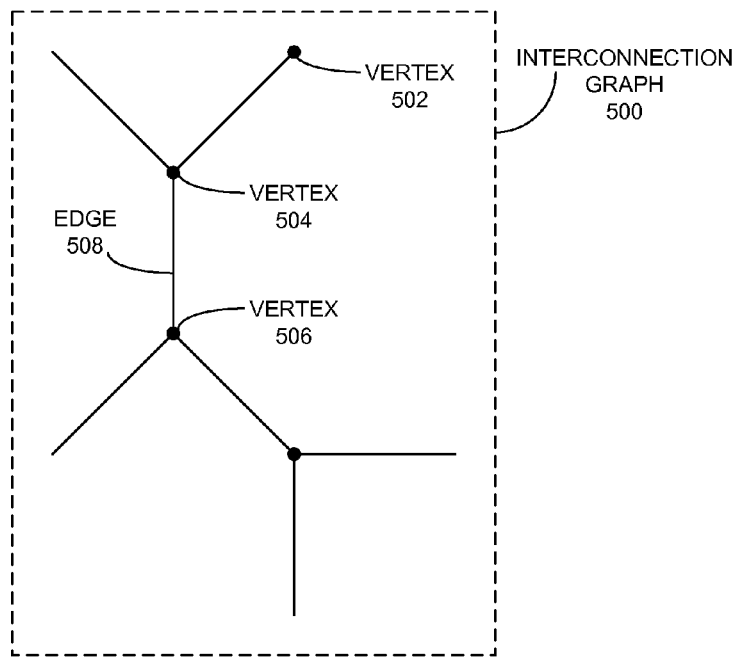
FIG. 5 illustrates an interconnection graph in accordance with an embodiment of the present invention.

FIG. 5 illustrates an interconnection graph in accordance with an embodiment of the present invention.

Interconnection graph 500 represents the topology of a net. Interconnection graph 500 can include a set of vertices and edges. A vertex can be associated with a pin or terminal (e.g., vertex 502), or a Steiner point (e.g., vertices 504-506). An edge can be associated with a sequence of electrically connected routing shapes. For example, edge 508 can be associated with a sequence of routing shapes (e.g., sequence of shapes 400 in FIG. 4), such that vertex 504 is associated with a starting point for the sequence of shapes (e.g., start point 410) and vertex 506 is associated with an endpoint for the sequence of shapes (e.g., endpoint 418).

Figure 6:
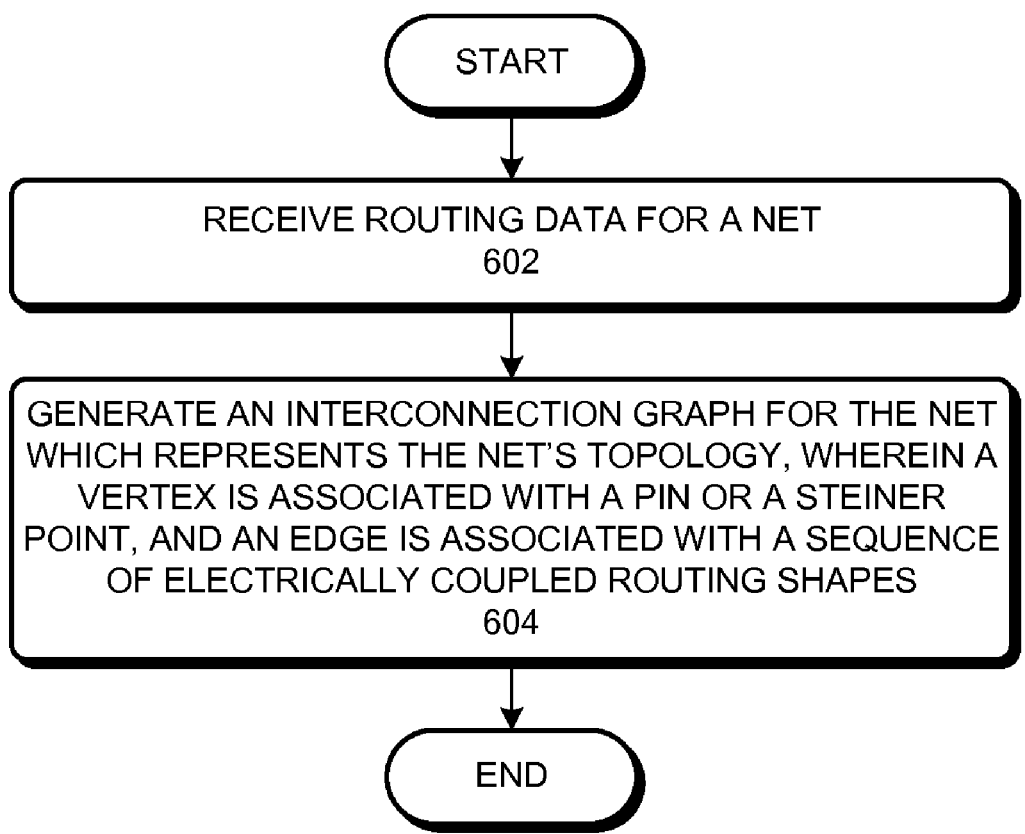
FIG. 6 presents a flow chart illustrating a process for generating an interconnection graph in accordance with an embodiment of the present invention.

FIG. 6 presents a flow chart illustrating a process for generating an interconnection graph in accordance with an embodiment of the present invention.

The process can be performed by a computer system which stores instructions and executes these instructions using a processor. The system can begin by receiving routing data for a net (operation 602). Next, the system can generate an interconnection graph for the net which represents the net's topology, wherein a vertex is associated with a pin or a Steiner point, and an edge is associated with a sequence of electrically connected routing shapes (operation 604).

Figure 7:
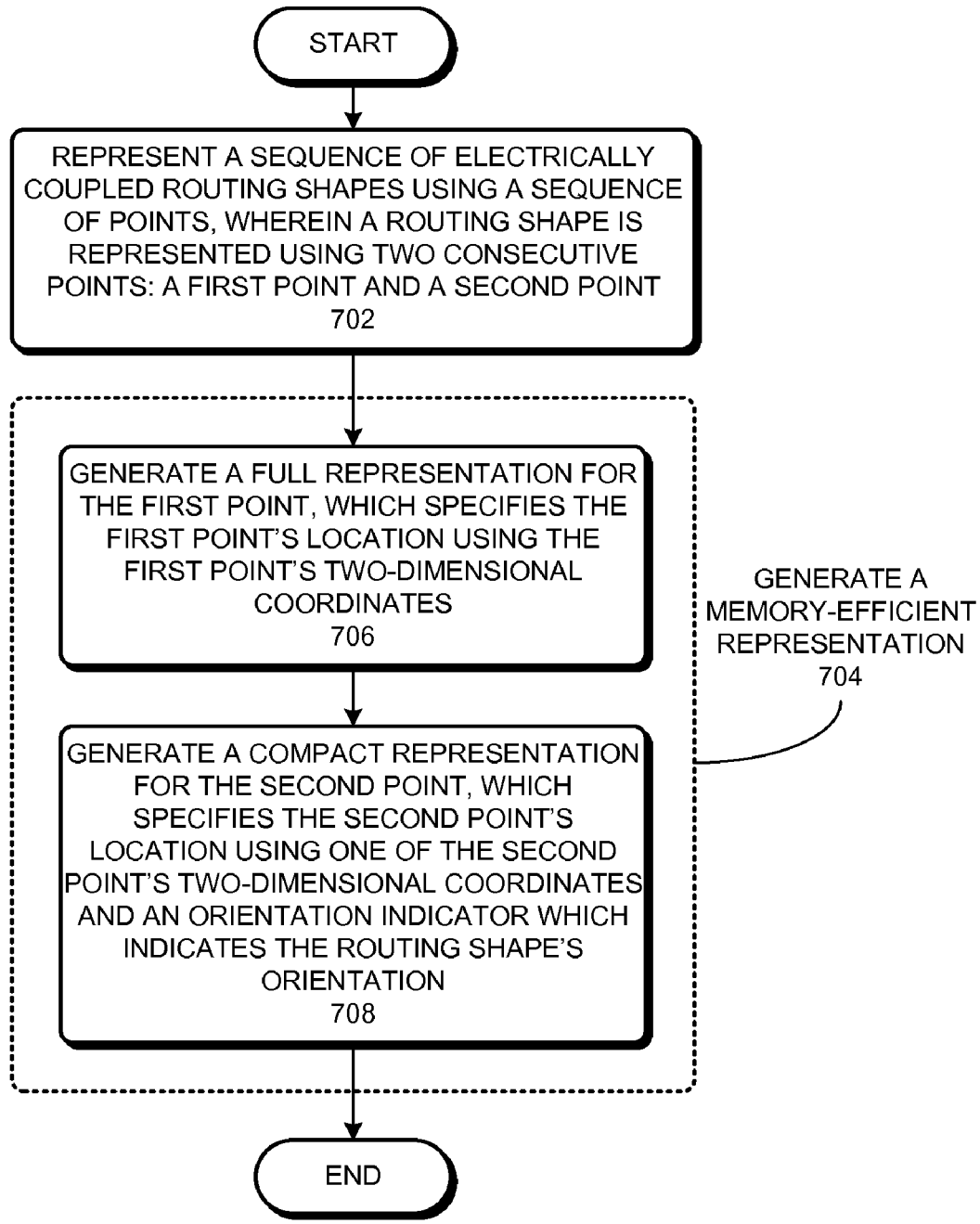
FIG. 7 presents a flow chart illustrating a process for generating a memory-efficient representation of a sequence of electrically connected routing shapes in accordance with an embodiment of the present invention.

FIG. 7 presents a flow chart illustrating a process for generating a memory-efficient representation of a sequence of electrically connected routing shapes in accordance with an embodiment of the present invention.

The process can begin by representing a sequence of electrically connected routing shapes using a sequence of points, wherein a routing shape is represented using two consecutive points: a first point and a second point (operation 702). Next, the system can generate a memory-efficient representation (operation 704) for the sequence of electrically connected routing shapes. Specifically, the system can generate a full representation of the first point, which specifies the first point's location using the first point's two-dimensional coordinates (operation 706). Next, the system can generate a compact representation of the second point, which specifies the second point's location using one of the second point's two-dimensional coordinates, and an orientation indicator which indicates the routing shape's orientation (operation 708).

During operation, a routing system may insert and/or delete points in a route. If a full point is deleted, the system can convert the compact representation of the next point in the sequence of points into a full representation. A user may introduce a patch shape in a route to satisfy a design rule. If a patch shape is located at an intersection of two routing shapes, the system can add information about the patch shape to the point that corresponds to the intersection of the two routing shapes.

Figure 8:
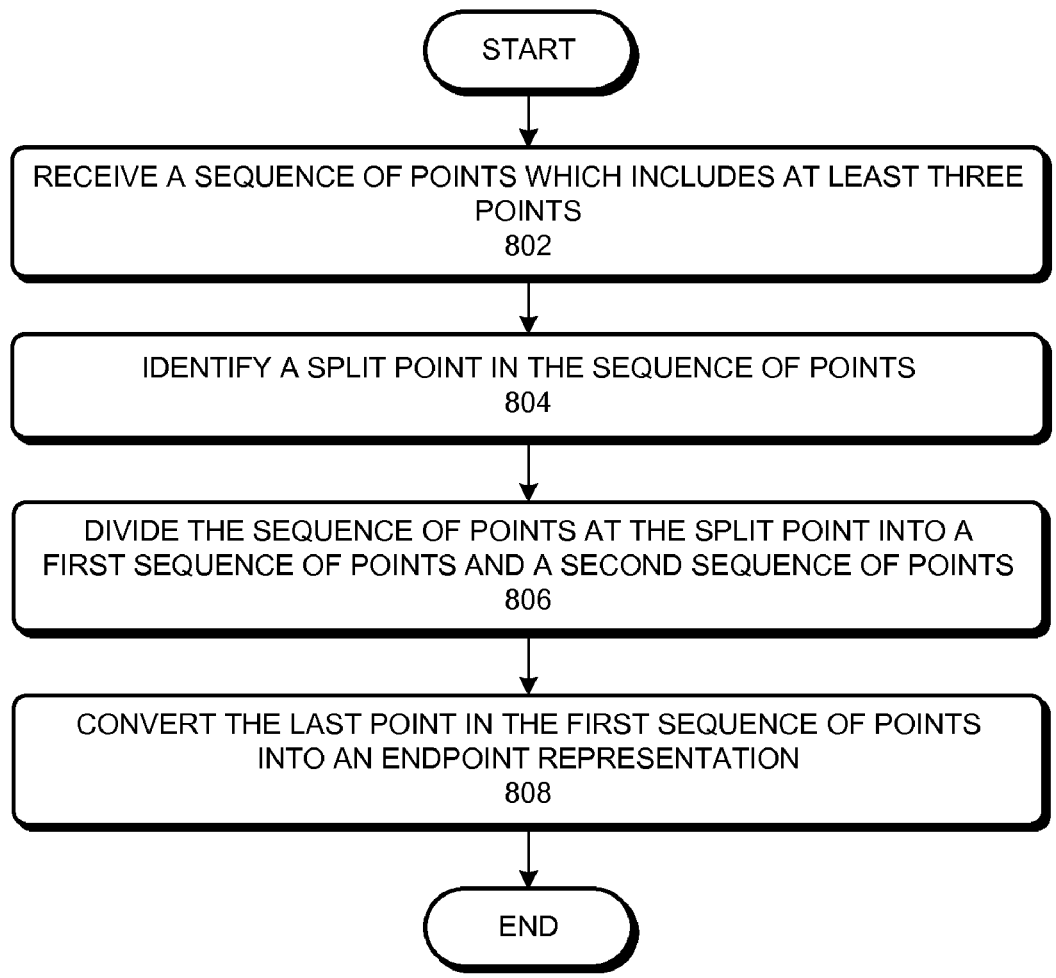
FIG. 8 presents a flow chart illustrating a process for dividing a sequence of points into two sequences in accordance with an embodiment of the present invention.

FIG. 8 presents a flow chart illustrating a process for dividing a sequence of points into two sequences in accordance with an embodiment of the present invention.

The system can begin by receiving a sequence of points which includes at least three points (operation 802). Then, the system can identify a split point in the sequence of points (operation 804). Next, the system can divide the sequence of points at the split point into a first sequence of points and a second sequence of points (operation 806). The system can then convert the last point in the first sequence of points into an endpoint representation (operation 808).

Abutting Connectivity Model for Routing

Determining and updating electrical connectivity is a very difficult problem to perform during a routing operation. To simplify the problem, conventional approaches use a centerline connectivity model. A centerline can be with or without endcap extensions. Centerlines with endcap extensions are typically used because the resulting representation models proper minimum intersection requirement better than cetnerlines without endcap extension.

Figure 9A:
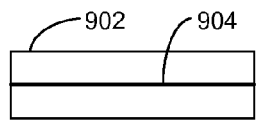
FIG. 9A illustrates a centerline without endcap extensions in accordance with an embodiment of the present invention.

FIG. 9A illustrates a centerline without endcap extensions in accordance with an embodiment of the present invention. Specifically, routing shape 902 includes centerline 904 without endcap extensions. Note that the endpoints of centerline 904 extend to the perimeter of routing shape 902.

Figure 9B:
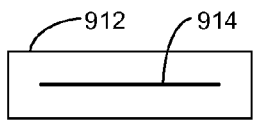
FIG. 9B illustrates a centerline with endcap extensions in accordance with an embodiment of the present invention.

FIG. 9B illustrates a centerline with endcap extensions in accordance with an embodiment of the present invention. Specifically, routing shape 912 includes centerline 914 with endcap extensions. Note that the endpoints of centerline 914 terminate at a predetermined endcap distance before the perimeter of routing shape 912. When centerlines with endcap extensions are used, the system can electrically couple two routing shapes by making them overlap (e.g., routing shapes 922-924 of FIG. 9C) so that their centerlines intersect (e.g., centerlines 926-928 of FIG. 9C).

Figure 9C:
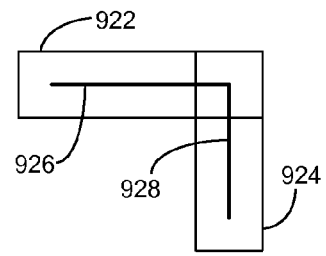
FIG. 9C illustrates how electrical connectivity between a set of routing shapes can be determined by traversing the centerlines in accordance with an embodiment of the present invention.

FIG. 9C illustrates how electrical connectivity between a set of routing shapes can be determined by traversing the centerlines in accordance with an embodiment of the present invention. Specifically, to determine whether routing shapes 922 and 924 are electrically connected, the system can determine if their centerlines intersect. This process can be used to determine the electrical connectivity of a set of routing shapes by traversing the centerlines associated with the set of routing shapes.

Note that the conventional approach for determining electrical connectivity requires the centerlines to intersect. Therefore, if two routing shapes overlap but their centerlines do not intersect, a conventional approach will incorrectly determine that the two routing shapes are not electrically connected. In such situations, the centerline connectivity model will not represent the actual electrical connectivity of a set of routing shapes.

It is important that the routing system accurately determine electrical connectivity (hereinafter referred to as "connectivity" for short). For example, if connectivity is not determined accurately, the routing system may create loops which can cause performance problems. Further, a user may create a patch to electrically link two wires, but the routing system may not detect that the two wires are electrically connected using the centerline approach. As a result, the routing system may generate incorrect routing shapes to try to electrically link wires that are already electrically connected. Without proper detection of intersections between centerlines, many design rule checks may require expensive on-the-fly intersection queries to be performed to determine intersecting routing shapes. In addition, many design rule violations can be easily fixed by applying metal patches that are not "centerline connected" to existing wires. Since the routing task for a net is to electrically connect all shapes/pins together without dangling shapes (i.e., shapes that are electrically connected only at one end) or float shapes (i.e., shapes that are not electrically connected at either end), missed connectivity can also mislead the router to prune away the parts that it falsely thinks are dangling or floating. As a result, the routing system may be forced to be overly conservative and generate large shapes just to maintain the centerline connectivity, and/or not use many types of patches which are effective in fixing design rule violations.

Note that an abutting connectivity model is accurate because it determines connectivity based on whether the shapes overlap or not. Unfortunately, the abutting connectivity model is not as easy to work with as the centerline connectivity model, and further it is difficult to represent the abutting connectivity model in a consistent way, especially when routing shapes are modified repeatedly during routing. On the other hand, although the centerline connectivity model is inaccurate, it enables connectivity information to be represented intuitively, consistently, and efficiently.

Figure 10A:
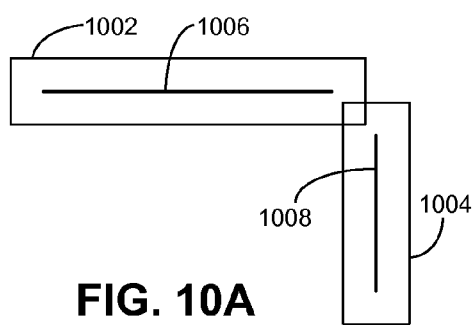
FIG. 10A illustrates two electrically connected routing shapes whose centerlines do not intersect.

FIG. 10A illustrates two electrically connected routing shapes whose centerlines do not intersect. Specifically, shape 1002 overlaps with shape 1004, but centerline 1006 for shape 1002 does not intersect with centerline 1008 for shape 1004. Therefore, a conventional approach for determining connectivity may determine that routing shapes 1002 and 1004 are not electrically connected.

Figure 10B:
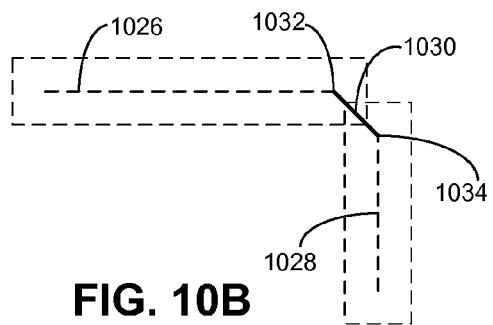
FIG. 10B illustrates a virtual centerline that allows a centerline connectivity model to correctly represent electrical connectivity in accordance with an embodiment of the present invention.

FIG. 10B illustrates a virtual centerline that allows a centerline connectivity model to correctly represent electrical connectivity in accordance with an embodiment of the present invention. Note that a virtual shape is not an actual routing shape in the physical layout. However, a virtual shape is treated like an actual shape for determining connectivity. Specifically, FIG. 10B illustrates a virtual shape with centerline 1030, which intersects with centerline 1026 at a point 1032, and intersects with centerline 1028 at a point 1034.

Figure 11A:
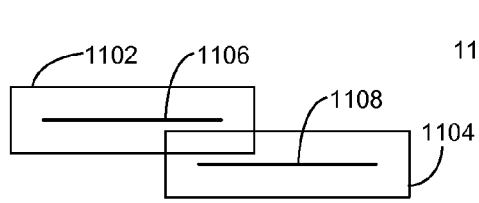
FIG. 11A illustrates two electrically connected routing shapes whose centerlines do not intersect.

FIG. 11A illustrates two electrically connected routing shapes whose centerlines do not intersect. Specifically, shape 1102 overlaps with shape 1104, but centerline 1106 for shape 1102 does not intersect with centerline 1108 for shape 1104. Therefore, a conventional approach for determining connectivity may determine that routing shapes 1102 and 1104 are not electrically connected.

Figure 11B:
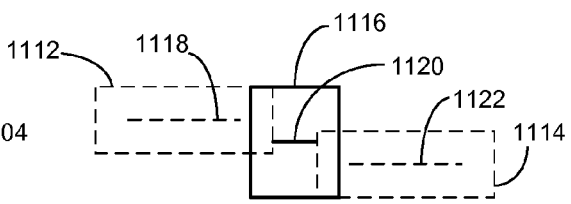
FIGS. 11B and 11C illustrate a situation in which adding a virtual shape involves adjusting the original routing shapes and creating a new routing shape in accordance with an embodiment of the present invention.
Figure 11C:
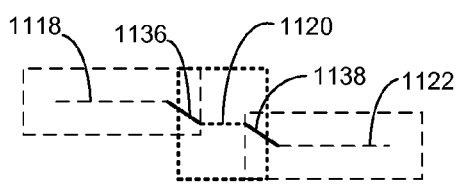

FIGS. 11B and 11C illustrate a situation in which adding a virtual shape involves adjusting the original routing shapes and creating a new routing shape in accordance with an embodiment of the present invention.

To add a virtual shape in the situation shown in FIG. 11A, the system may first adjust routing shapes 1102 and 1104 to reduce an overlap length between shapes 1102 and 1104. Specifically, as shown in FIG. 11B, the system may also adjust the routing shapes 1102 and 1104 so that they do not overlap. Next, the system can create a new routing shape (i.e., routing shape 1116), which is represented by a new centerline with an endcap extension (i.e., centerline 1120), such that routing shape 1116 overlaps with adjusted routing shapes 1112 and 1114.

As shown in FIG. 11C, the system can then create two virtual shapes: one virtual shape whose centerline 1136 intersects with centerlines 1118 and 1120, and a second virtual shape whose centerline 1138 intersects with centerlines 1122 and 1120.

In this manner, by using virtual shapes, some embodiments of the present invention provide the accuracy of an abutting connectivity model and the intuitiveness, consistency, and efficiency of a centerline connectivity model.

Figure 12:
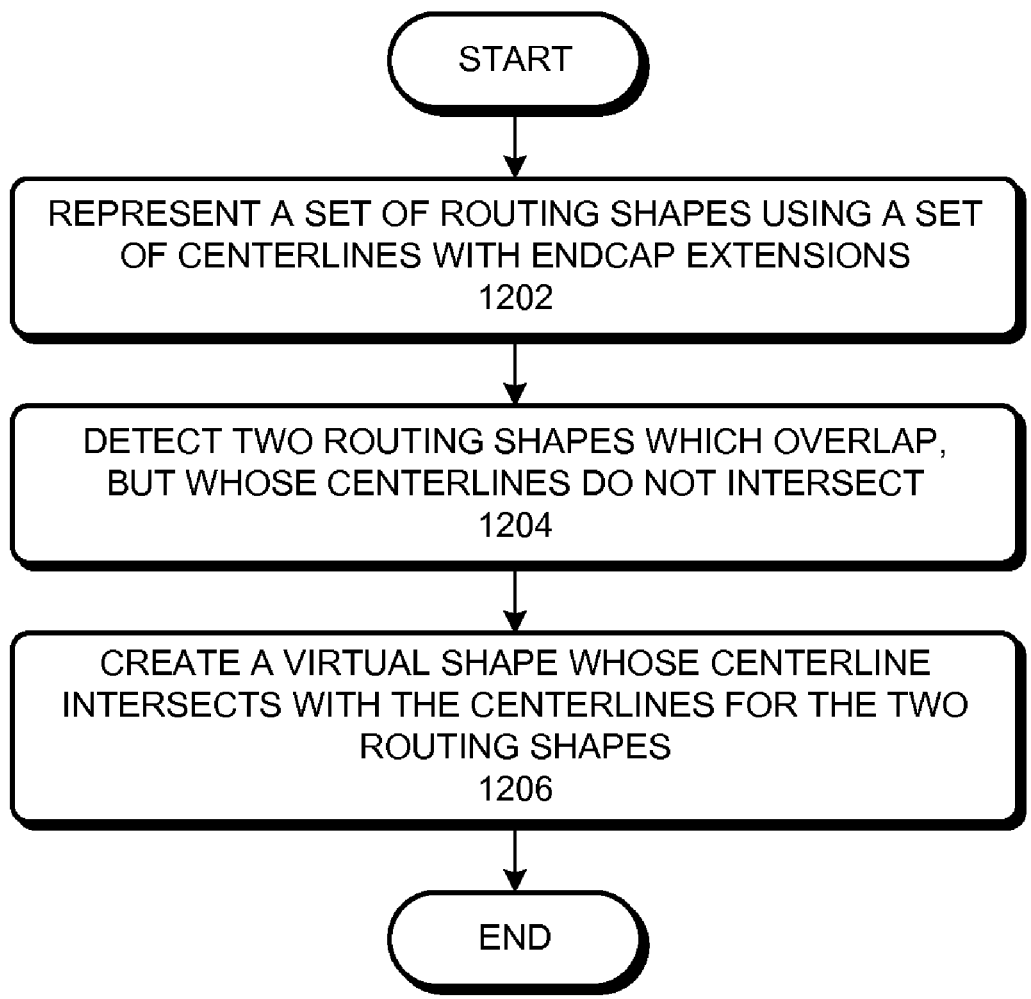
FIG. 12 presents a flow chart illustrating a process to generate a centerline connectivity representation of a set of routing shapes in accordance with an embodiment of the present invention.

FIG. 12 presents a flow chart illustrating a process to generate a centerline connectivity representation of a set of routing shapes in accordance with an embodiment of the present invention.

The process can begin by representing a set of routing shapes using a set of centerlines with endcap extensions (operation 1202), such that an intersection between two centerlines represents an electrical coupling between two routing shapes associated with the two centerlines. Next, the system detects two routing shapes which overlap, but whose centerlines do not intersect (operation 1204). For example, in FIG. 10A, routing shapes 1002 and 1004 overlap, but their centerlines do not intersect. The system can then create a virtual shape whose centerline intersects with the centerlines for the two routing shapes (operation 1206).

Figure 13:
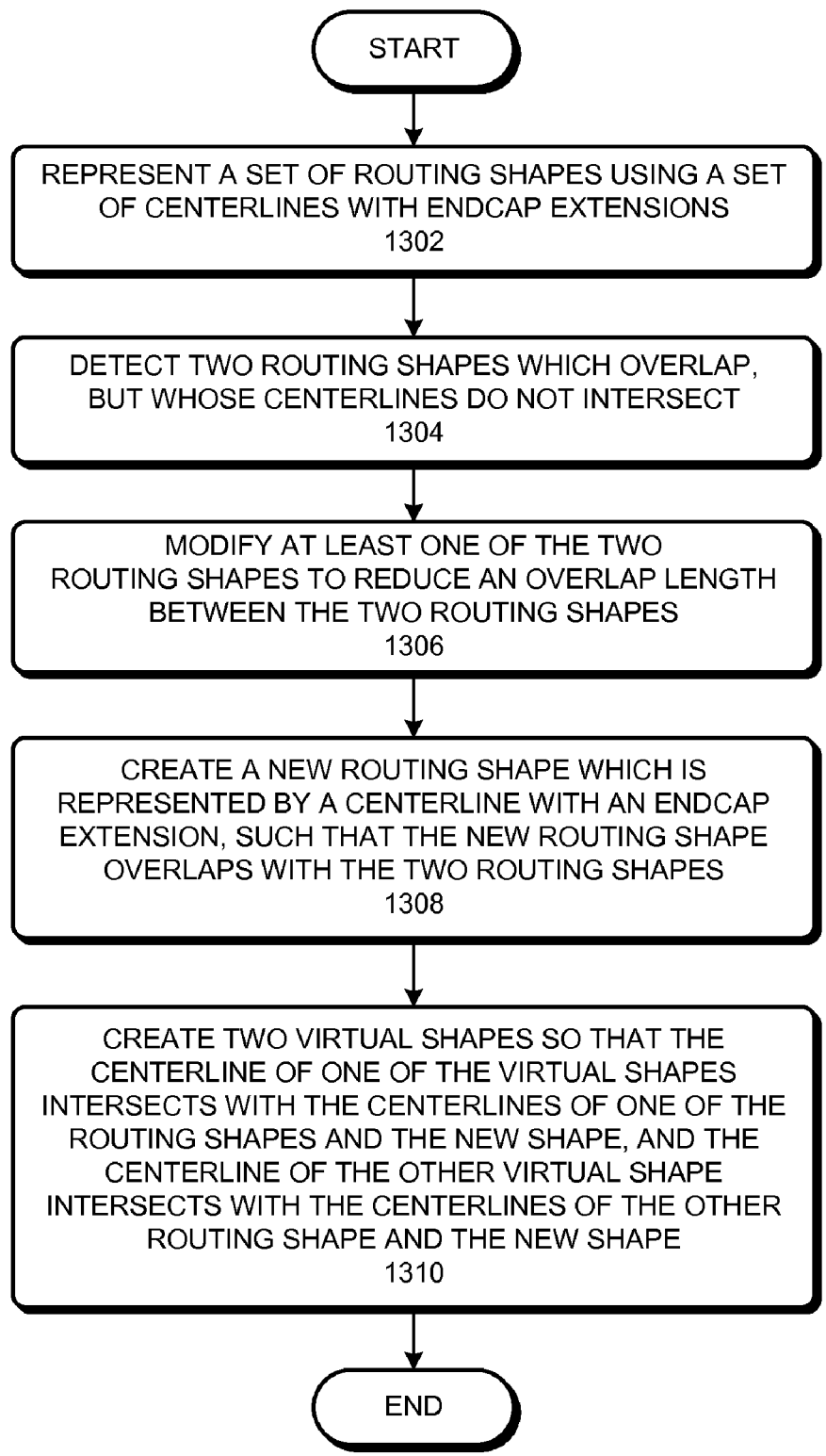
FIG. 13 presents a flow chart illustrating a process to generate a centerline connectivity representation of a set of routing shapes in accordance with an embodiment of the present invention.

FIG. 13 presents a flow chart illustrating a process to generate a centerline connectivity representation of a set of routing shapes in accordance with an embodiment of the present invention.

The process can begin by representing a set of routing shapes using a set of centerlines with endcap extensions (operation 1302), such that an intersection between two centerlines represents an electrical coupling between two routing shapes associated with the two centerlines. Next, the process can detect two routing shapes which overlap, but whose centerlines do not intersect (operation 1304). The system can then modify at least one of the two routing shapes to reduce an overlap length between the two routing shapes (operation 1306).

In some embodiments, the system can adjust only one of the two routing shapes. Alternatively, the system can adjust both routing shapes. Further, the shapes may or may not overlap after adjustment. For example, in FIG. 11B, routing shapes 1112 and 1114 do not overlap.

The system can then create a new routing shape which is represented by a centerline with an endcap extension, such that the new routing shape overlaps with the two routing shapes (operation 1308). Next, the system can create two virtual shapes so that the centerline of one of the virtual shapes intersects with the centerlines of one of the routing shapes and the new shape, and the centerline of the other virtual shape intersects with the centerlines of the other routing shape and the new shape (operation 1310). For example, in FIG. 11C, centerline 1136 of one of the virtual shapes intersects with centerlines 1118 and 1120, and centerline 1138 of the other virtual shape intersects with centerlines 1122 and 1120.

Figure 14:
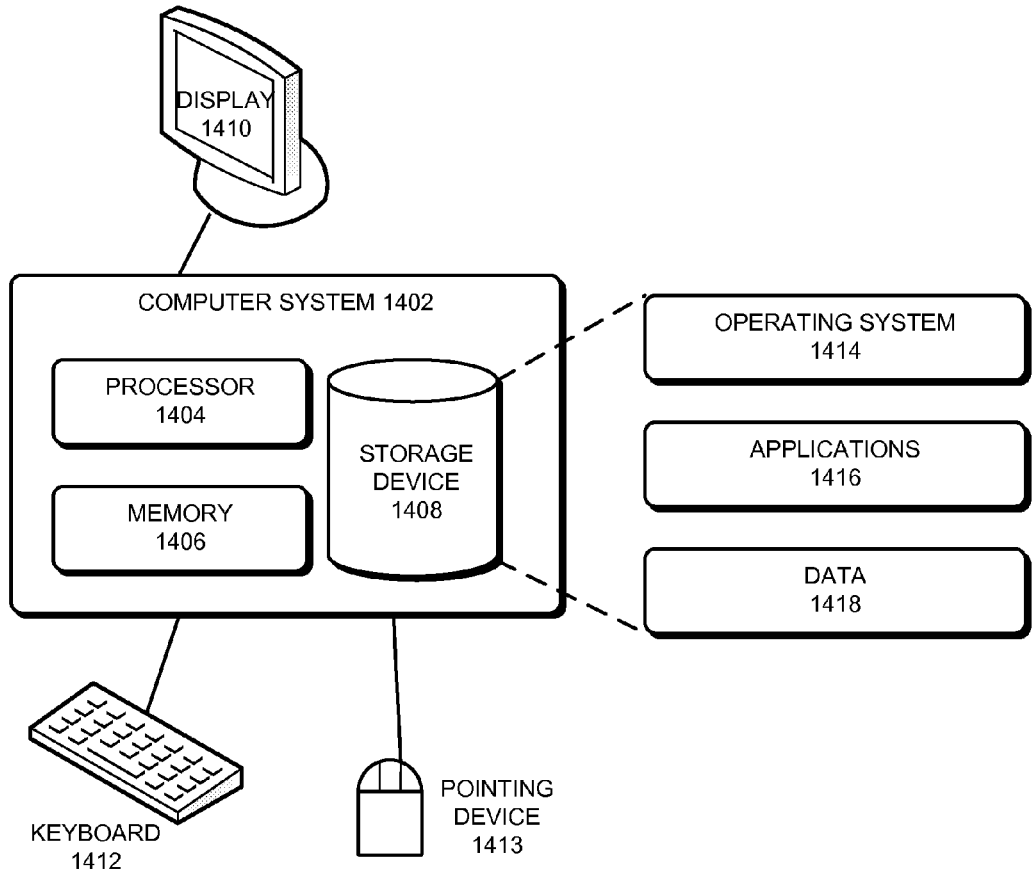
FIG. 14 illustrates a computer system in accordance with an embodiment of the present invention.

FIG. 14 illustrates a computer system in accordance with an embodiment of the present invention. Computer system 1402 includes a processor 1404, a memory 1406, and a storage device 1408. Furthermore, computer system 1402 can be coupled to a display device 1410, a keyboard 1412, and a pointing device 1413.

Storage device 1408 can store operating system 1414, applications 1416, and data 1418. Applications 1416 can include instructions, which when executed by computer system 1402, can cause computer system 1402 to perform methods and/or processes described in this disclosure. Specifically, applications 1416 can include instructions for generating a memory-efficient representation of a sequence of electrically connected routing shapes and for generating a centerline connectivity representation of a set of routing shapes. Data 1418 can include any data that is required as input or that is generated as output by the methods and/or processes described in this disclosure. Specifically, data 1418 can store a representation of a sequence of points which represents a sequence of electrically connected routing shapes.

Figure 15:
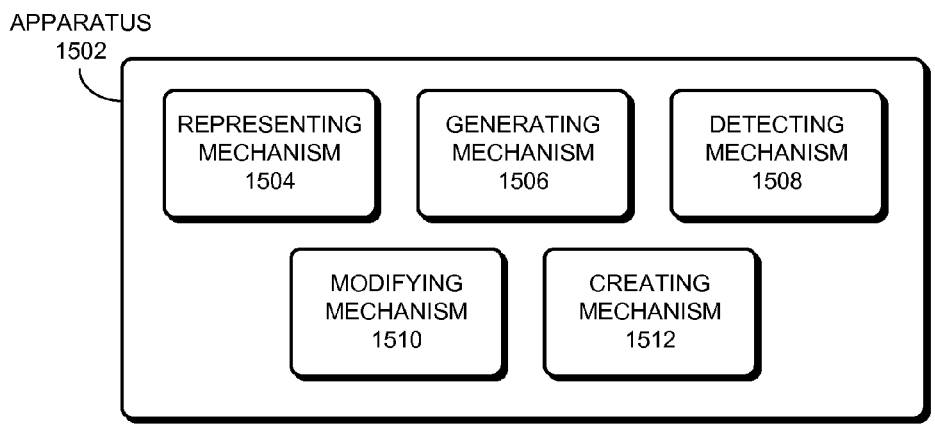
FIG. 15 illustrates an apparatus in accordance with an embodiment of the present invention.

FIG. 15 illustrates an apparatus in accordance with an embodiment of the present invention.

Apparatus 1502 can comprise a plurality of mechanisms which may communicate with one another via a wired or wireless communication channel. Apparatus 1502 may be realized using one or more integrated circuits, and apparatus 1502 may include fewer or more mechanisms than those shown in FIG. 15. Further, apparatus 1502 may be integrated in a computer system, or it may be realized as a separate device which is capable of communicating with other computer systems and/or devices. Specifically, apparatus 1502 can comprise representing mechanism 1504, generating mechanism 1506, detecting mechanism 1508, adjusting mechanism 1510, and creating mechanism 1512.

In some embodiments, representing mechanism 1504 may be configured to represent a sequence of electrically connected routing shapes using a sequence of points, wherein a routing shape is represented using two consecutive points. Generating mechanism 1506 may be configured to generate a full representation of one of the points in the two consecutive points, which specifies the point's location using the point's two-dimensional coordinates. Further, generating mechanism 1506 may be configured to generate a compact representation of the other point, which specifies the point's location using one of the point's two-dimensional coordinates and an orientation indicator which indicates the routing shape's orientation.

In some embodiments, representing mechanism 1504 may be configured to represent a set of routing shapes using a set of centerlines with endcap extensions, wherein an intersection between two centerlines represents an electrical coupling between two routing shapes associated with the two centerlines. Detecting mechanism 1508 may be configured to detect two routing shapes which overlap, but whose centerlines do not intersect. Modifying mechanism 1510 may be configured to modify at least one dimension of at least one of the two routing shapes to reduce an overlap length between the two routing shapes. Creating mechanism 1512 may be configured to create a new routing shape and/or one or more virtual shapes.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method to generate a memory-efficient representation of a sequence of electrically connected routing shapes, the method comprising:
representing the sequence of electrically connected routing shapes using a sequence of points, wherein a first routing shape is represented using two consecutive points: a first point and a second point; and
generating the memory-efficient representation by:
generating, by computer, a full representation of the first point, which specifies the first point's location using the first point's two-dimensional coordinates; and
generating a compact representation of the second point, which specifies the second point's location using one of the second point's two-dimensional coordinates and an orientation indicator which indicates the first routing shape's orientation, and wherein if the first point is deleted, converting the compact representation of the second point into a full representation if the point before the first point is represented using a compact representation.

2. The method of claim 1, wherein at least one of any two consecutive points in the sequence of points is represented using a full representation.

3. The method of claim 1, the method further comprising representing a via by assigning different metal layers to the first and second points.

4. The method of claim 1, wherein the last point in the sequence of points is represented using an endpoint representation.

5. The method of claim 1, wherein if a patch shape is located at an intersection of two routing shapes, the method further comprises associating information about the patch shape with a point that corresponds to the intersection of the two routing shapes.

6. The method of claim 1, wherein if the sequence of points is divided into a first sequence of points and a second sequence of points, the method further comprises converting the last point in the first sequence of points into an endpoint representation.

7. A non-transitory computer-readable storage medium storing instructions that when executed by a computer cause the computer to perform a method to generate a memory-efficient representation of a sequence of electrically connected routing shapes, the method comprising:
representing the sequence of electrically connected routing shapes using a sequence of points, wherein a first routing shape is represented using two consecutive points: a first point and a second point; and
generating the memory-efficient representation by:
generating a full representation of the first point, which specifies the first point's location using the first point's two-dimensional coordinates; and
generating a compact representation of the second point, which specifies the second point's location using one of the second point's two-dimensional coordinates and an orientation indicator which indicates the first routing shape's orientation and wherein if the first point is deleted, converting the compact representation of the second point into a full representation if the point before the first point is represented using a compact representation.

8. The computer-readable storage medium of claim 7, wherein at least one of any two consecutive points in the sequence of points is represented using a full representation.

9. The computer-readable storage medium of claim 7, the method further comprising representing a via by assigning different metal layers to the first and second points.

10. The computer-readable storage medium of claim 7, wherein the last point in the sequence of points is represented using an endpoint representation.

11. The computer-readable storage medium of claim 7, wherein if a patch shape is located at an intersection of two routing shapes, the method further comprises associating information about the patch shape with a point that corresponds to the intersection of the two routing shapes.

12. The computer-readable storage medium of claim 7, wherein if the sequence of points is divided into a first sequence of points and a second sequence of points, the method further comprises converting the last point in the first sequence of points into an endpoint representation.

13. An apparatus to generate a memory-efficient representation of a sequence of electrically connected routing shapes, the apparatus comprising:
a representing mechanism configured to represent the sequence of electrically connected routing shapes using a sequence of points, wherein a first routing shape is represented using two consecutive points: a first point and a second point; and
a generating mechanism configured to generate the memory-efficient representation by:
generating a full representation of the first point, which specifies the first point's location using the first point's two-dimensional coordinates; and
generating a compact representation of the second point, which specifies the second point's location using one of the second point's two-dimensional coordinates and an orientation indicator which indicates the first routing shape's orientation and wherein if the first point is deleted, converting the compact representation of the second point into a full representation if the point before the first point is represented using a compact representation.

14. The apparatus of claim 13, wherein at least one of any two consecutive points in the sequence of points is represented using a full representation.

15. The apparatus of claim 13, wherein the representing mechanism is further configured to represent a via by assigning different metal layers to the first and second points.

16. The apparatus of claim 13, wherein the representing mechanism is further configured to represent the last point in the sequence of points using an endpoint representation.

17. The apparatus of claim 13, wherein if a patch shape is located at an intersection of two routing shapes, the representing mechanism is further configured to associate information about the patch shape with a point that corresponds to the intersection of the two routing shapes.

18. The apparatus of claim 13, wherein if the sequence of points is divided into a first sequence of points and a second sequence of points, the representing mechanism is further configured to convert the last point in the first sequence of points into an endpoint representation.

* * * * *